United States Patent [19]

Sawada et al.

[11] Patent Number: 5,079,613
[45] Date of Patent: Jan. 7, 1992

[54] SEMICONDUCTOR DEVICE HAVING DIFFERENT IMPURITY CONCENTRATION WELLS

[75] Inventors: Shizuo Sawada, Yokohama; Syuso Fujii, Kawasaki; Masaki Ogihara, Yokohama, all of Japan

[73] Assignee: Kabushiki Kaisha Toshiba, Kawasaki, Japan

[21] Appl. No.: 609,076

[22] Filed: Nov. 7, 1990

Related U.S. Application Data

[63] Continuation of Ser. No. 216,045, Jul. 7, 1988, abandoned.

[30] Foreign Application Priority Data

Jul. 10, 1987 [JP] Japan ................. 62-172231
Jun. 24, 1988 [JP] Japan ................. 63-156538

[51] Int. Cl.$^5$ .................. H01L 27/02; H01L 29/78; H01L 27/04
[52] U.S. Cl. ................. 357/42; 357/23.6; 357/48
[58] Field of Search ........... 357/42, 23.12, 52, 23.6, 357/48; 365/207, 182

[56] References Cited

U.S. PATENT DOCUMENTS

| | | | |
|---|---|---|---|
| 4,233,672 | 11/1980 | Suzuki | 357/42 |
| 4,413,401 | 11/1983 | Klein et al. | 29/571 |
| 4,642,667 | 2/1987 | Magee | 357/42 |
| 4,672,410 | 6/1987 | Miura et al. | 357/23.6 |
| 4,673,962 | 6/1987 | Chatterjee et al. | 357/23.6 |
| 4,729,964 | 3/1988 | Natsuaki et al. | 437/29 |
| 4,918,502 | 4/1990 | Kaja et al. | 357/23.6 |

FOREIGN PATENT DOCUMENTS

| | | | |
|---|---|---|---|
| 57-192070 | 11/1982 | Japan | 357/42 |
| 58-48959 | 3/1983 | Japan | 357/42 |

OTHER PUBLICATIONS

S. M. Sze, "Physics of Semicondutor . . . " John Wiley, New York, 1981, pp. 94–96, 373.
Muller & Kamins, "Device Electronics . . . " John Wiley, New York, pp. 462–465.
European Search Report No. EP 88 11 0709 dated Dec. 18, 1988.
Patent Abstracts of Japan, vol. 7, No. 40 (E-159) (1185) Feb. 17, 1983.
Patent Abstracts of Japan, vol. 7, No. 65 (E-165) (1210), Mar. 18, 1983.
"An Experimental 4 Mb CMOS Dram", Furuyama et al., 1986 IEEE International SOlid-State Circuits Conference, ISSCC 86/Feb. 21, 1986.
"An Experimental 1-Mbit BiCmos Dram", Kitsukawa, et al., IEEE Journal of Solid-State Circuits, vol. SC-22, No. 5, Oct. 1987.
"Advanced BiCMOS Technology for High Speed VLSI", Ikeda et al., IEDM 86, IEEE 1986.
"Bipolar CMOS Merged Structure for High Speed M bit DRAM", Kobayashi, et al., IEDM 86, IEEE 1986.
"Physics and Technology of Semiconductor Devices", A. S. Grove, Fairchild Semiconductor, John Wiley and Sons, Inc., p. 209.
"Physics of Semiconductor Devices", S. M. Sze, John Wiley & Sons, pp. 192–193 and 196–197.

*Primary Examiner*—Andrew J. James
*Assistant Examiner*—Stephen D. Meier
*Attorney, Agent, or Firm*—Finnegan, Henderson, Farabow, Garrett & Dunner

[57] ABSTRACT

A semiconductor device comprises an N-type semiconductor substrate, a first P-type well formed in the semiconductor substrate, a second P-type well formed adjacent to the first P-type well in the semiconductor substrate, the surface impurity concentration of the second P-type well being set lower than that of the first P-type well, a DRAM memory cell structure formed in the first P-type well, and an MOS transistor structure formed in the second P-type well to function in combination with the memory cell structure.

35 Claims, 12 Drawing Sheets

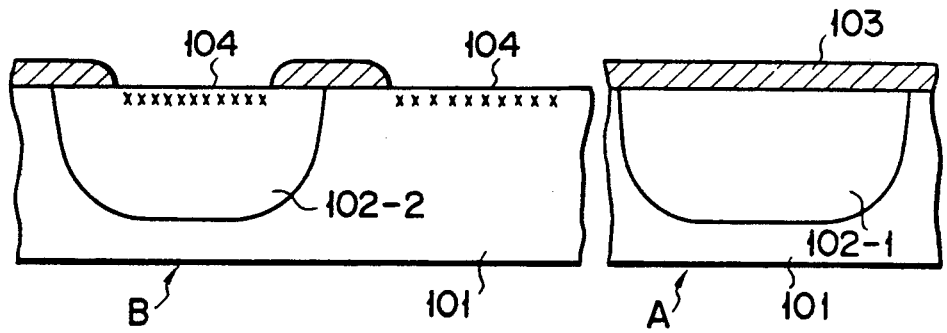
F I G. 2A
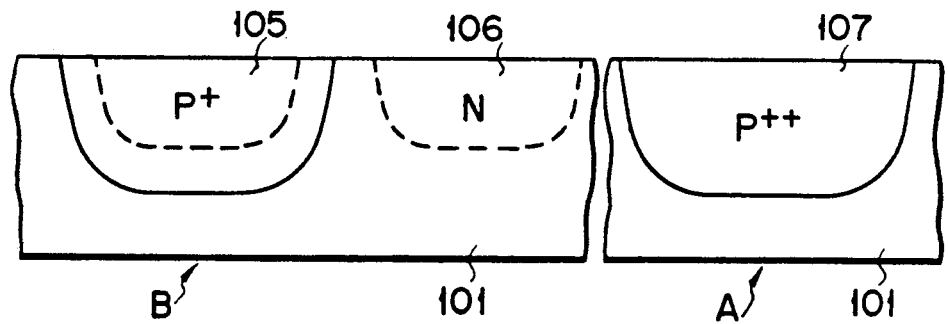
F I G. 2B
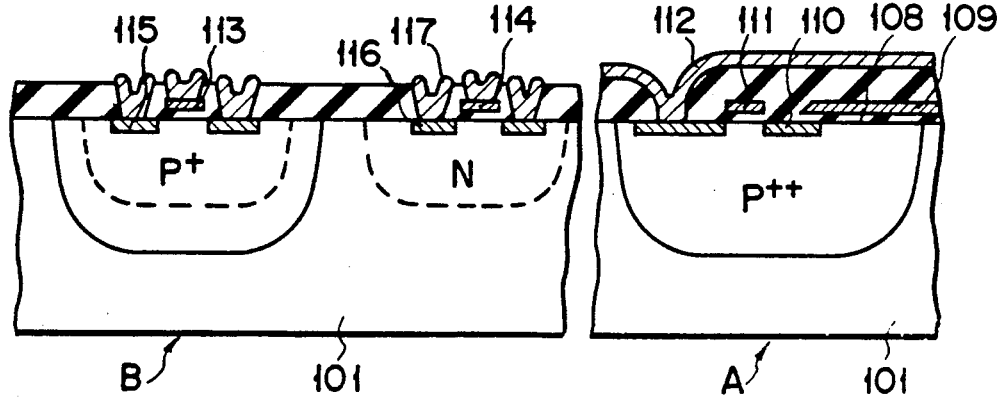
F I G. 2C

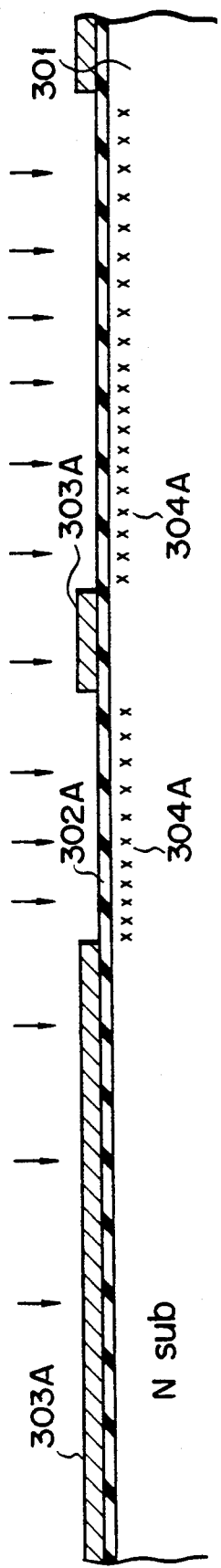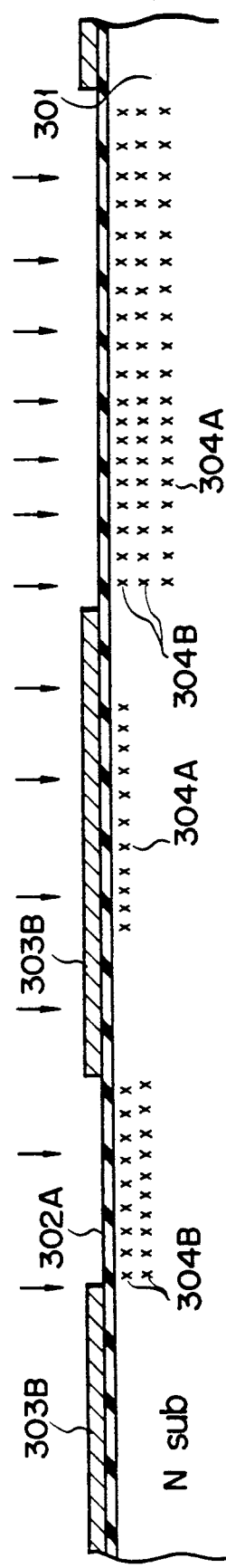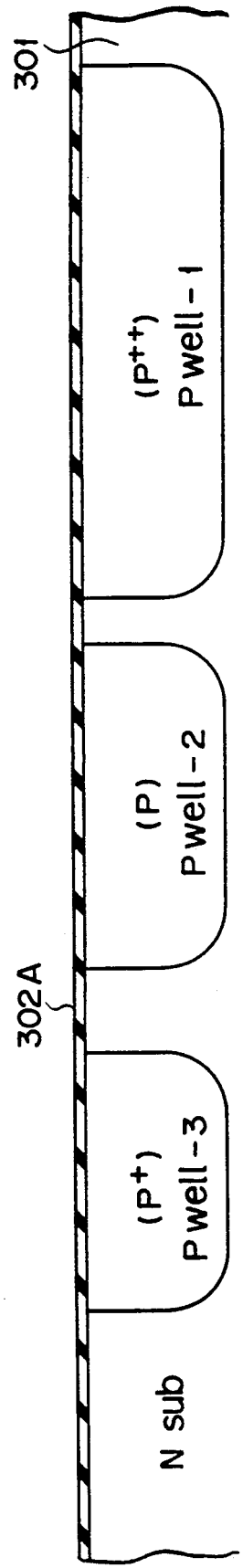

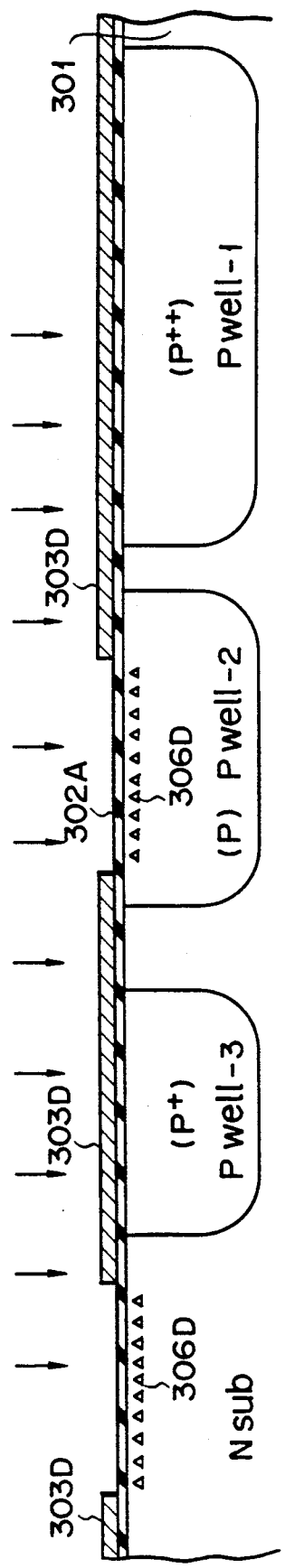
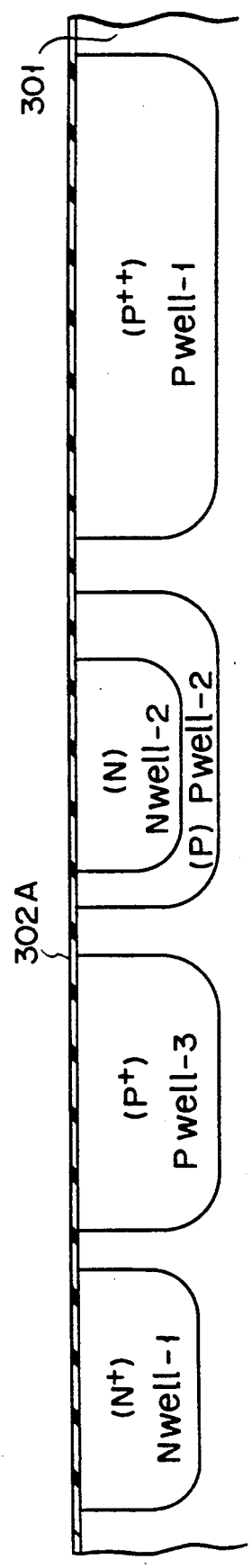

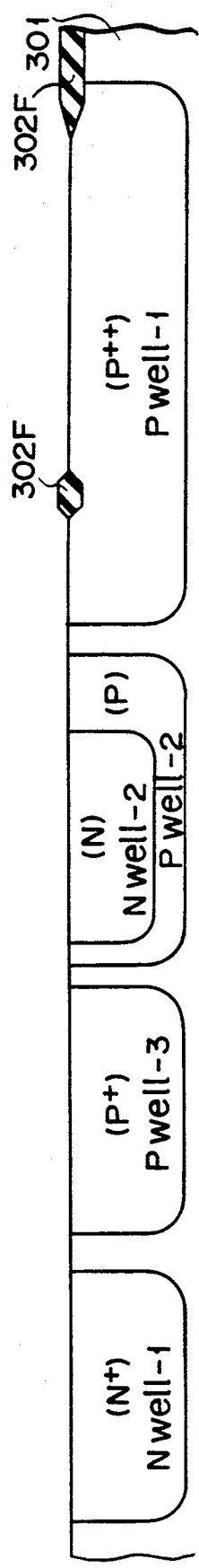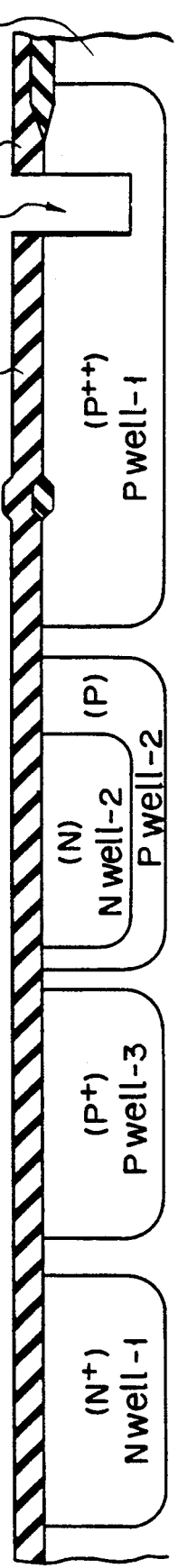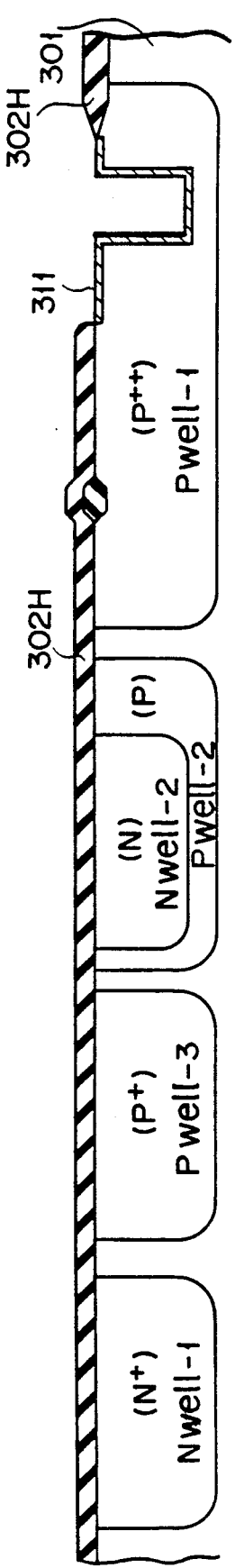

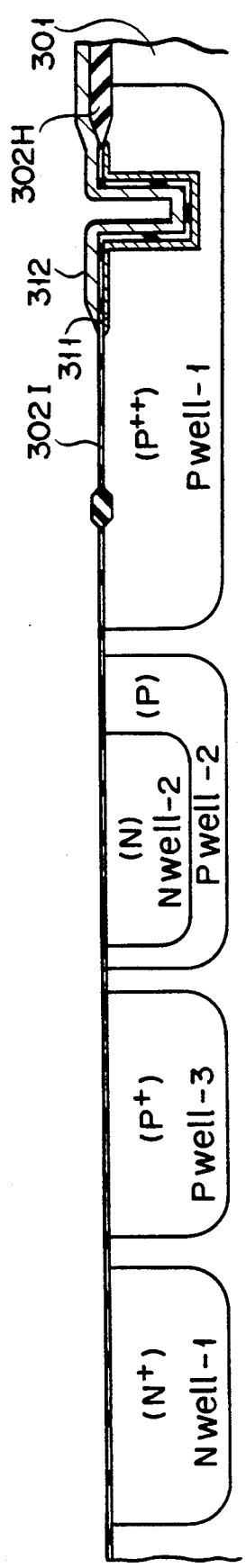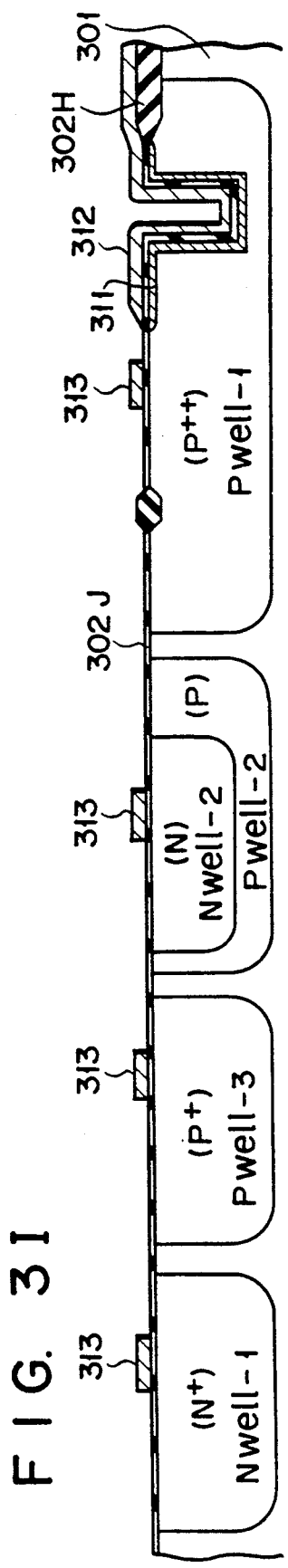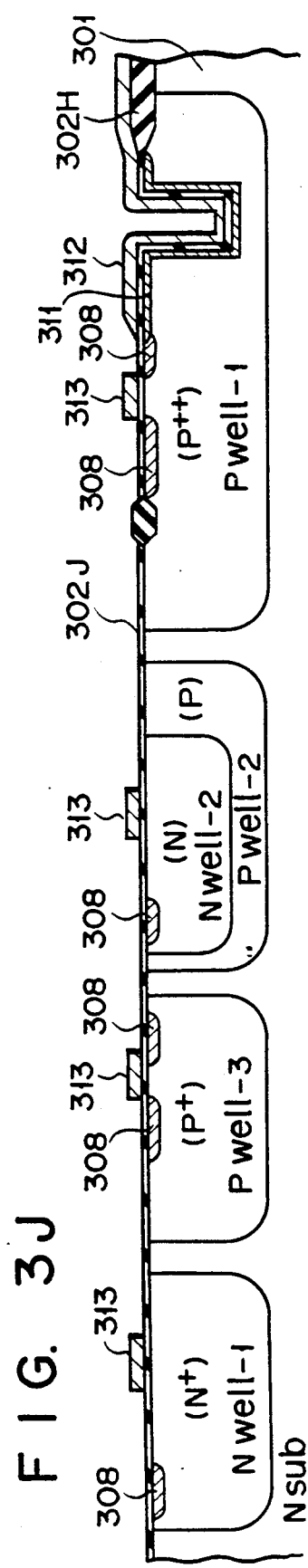

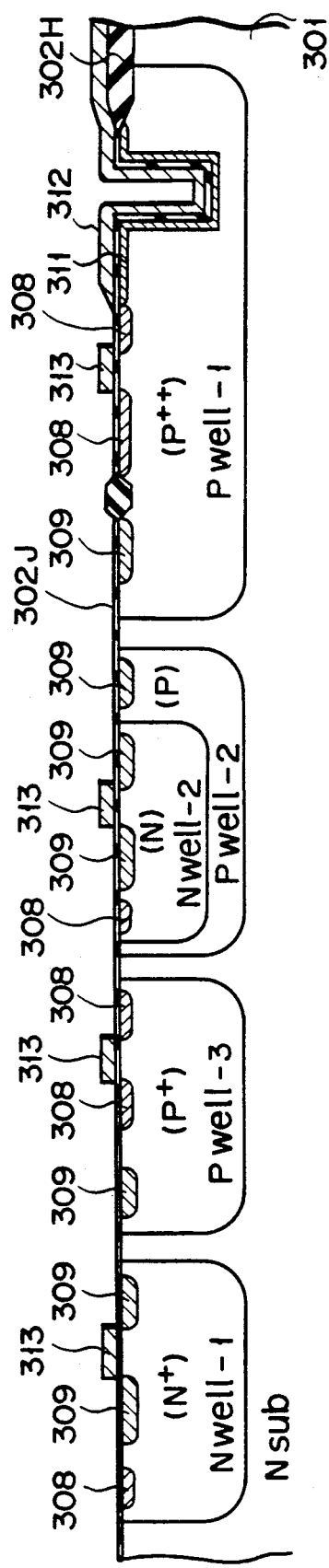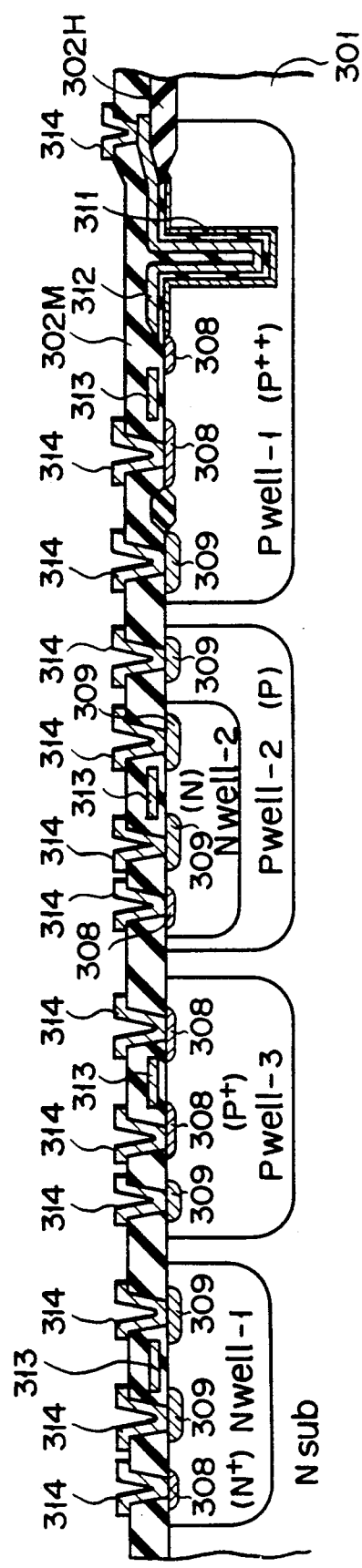

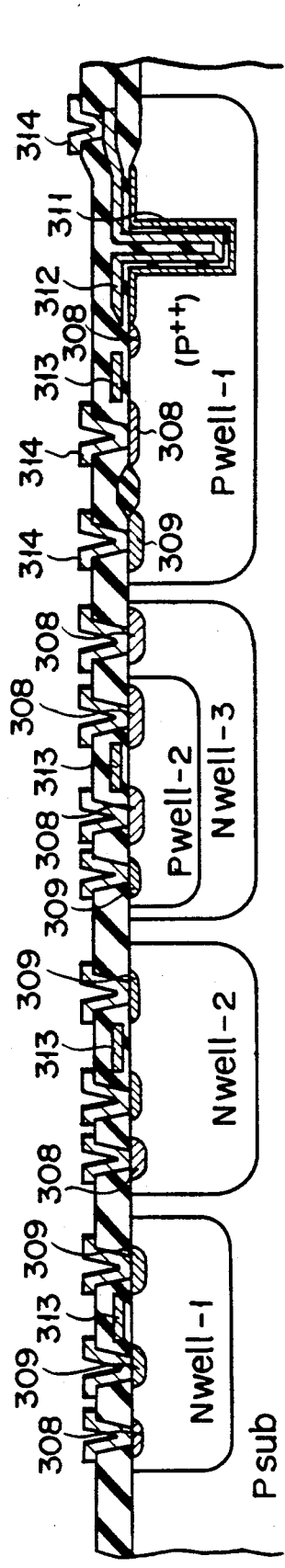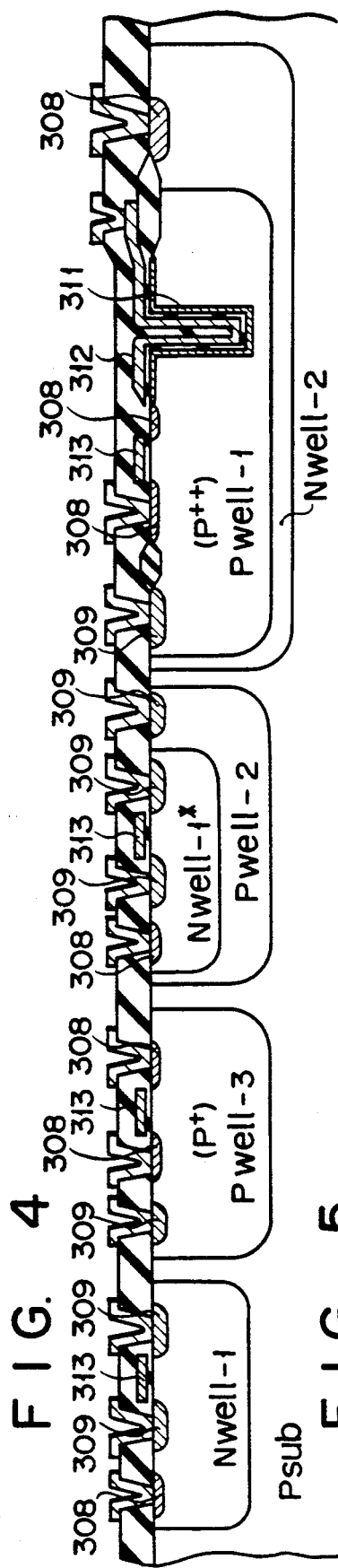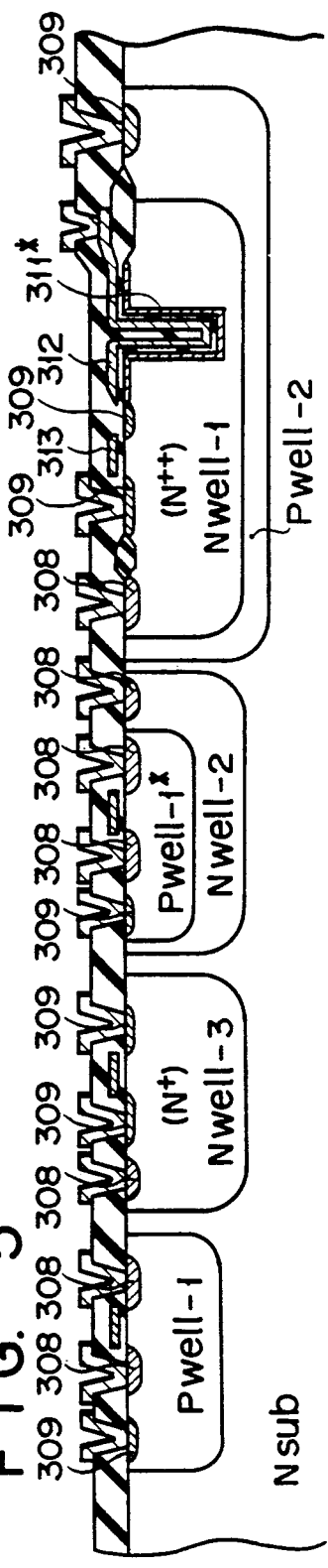

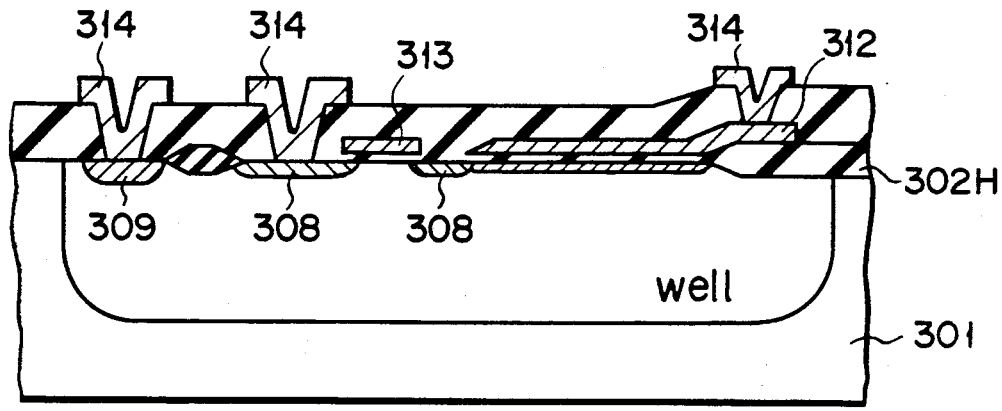
F I G. 13
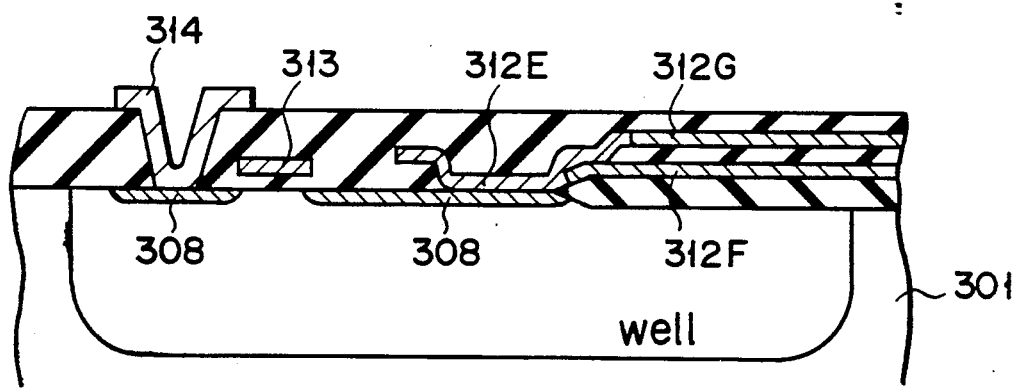
F I G. 14

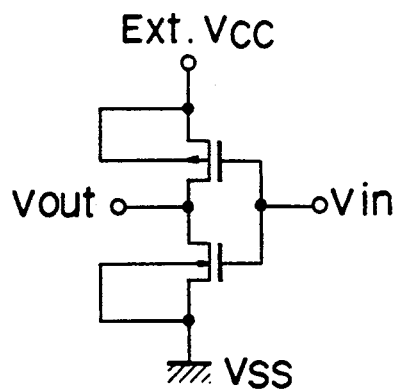
F I G. 15A
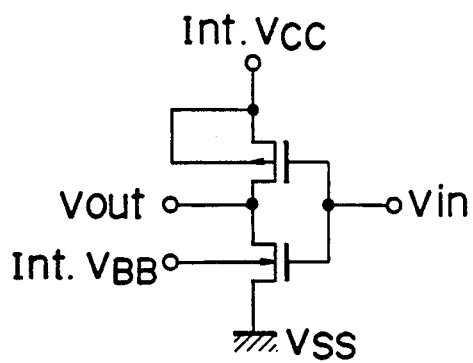
F I G. 15B
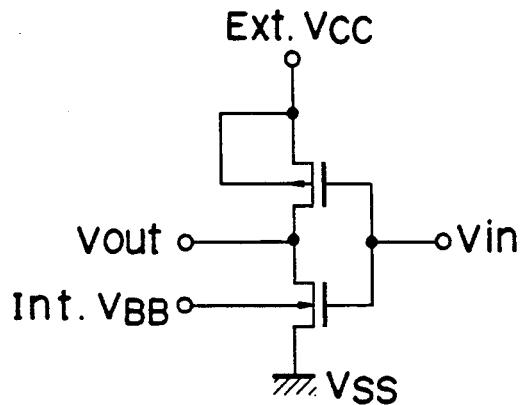
F I G. 15C
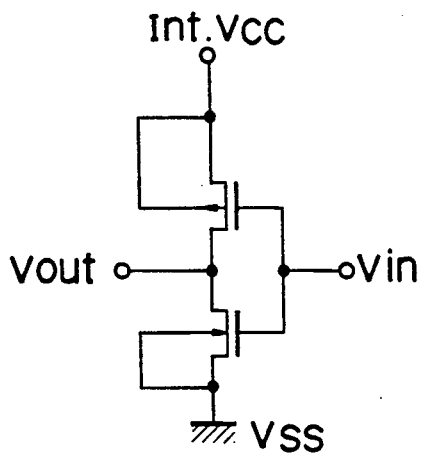
F I G. 15D
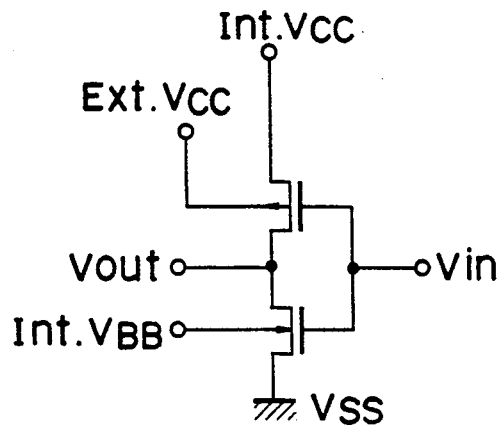
F I G. 15E

SEMICONDUCTOR DEVICE HAVING DIFFERENT IMPURITY CONCENTRATION WELLS

This application is a continuation of application Ser. No. 216,045, filed July 7, 1988, now abandoned.

BACKGROUND OF THE INVENTION

1. Field of the Invention

This invention relates to a semiconductor memory with well structure, and more particularly to a dynamic random access memory (DRAM) with CMOS structure.

2. Description of the Related Art

In the conventional DRAM, CMOS structure has not been employed to constitute the peripheral circuit of the memory cell array. Recently, however, use of DRAMs with CMOS structure is growing.

FIG. 1 shows an example of the cross section of a one-transistor/one-capacitor type DRAM with CMOS structure. In FIG. 1, 1 denotes a P-type Si body; 2 and 2*, P-wells formed in the same manufacturing step; 3, an N-well; 4, an insulation film for a capacitor; 5, a capacitor electrode; 6, the gate insulation film of a transistor; 7, the gate electrode of a transistor; 8 and 8*, $N^+$-type diffusion layers (source, drain); 9, $P+$-type diffusion layers (source, drain); 10, an insulation film; 11, an A wiring layer; A, a memory cell section; and B, the peripheral circuit thereof. P-well layer 2 is formed to have an impurity concentration higher than that of P-type substrate 1.

Recently, it was found preferable to form a memory cell in a high impurity concentration well in order to prevent a soft error.

In a conventional memory device, the impurity concentration of P-well 2*, in which the memory cell is formed, is the same as that of P-well 2, in which the peripheral circuit is formed. Therefore, it becomes necessary to further increase the impurity concentration of the well for the memory cell in order to suppress the soft error. From the circuit characteristic point of view, it is not desirable to excessively increase the impurity concentration of the well because it will increase the diffusion capacitance between $N^+$-type layer 8* and P-well 2* and lower the junction breakdown voltage. If the miniaturization technique of the IC internal structure is further advanced, it becomes necessary to operate the internal circuit on a voltage of 2 to 4 V, despite the fact that the input/output circuit section of the IC is operated on a voltage of 5 V. Thus, it becomes necessary to adequately change the impurity concentration of the well, such as P-wells 2 and 2*, according to the difference in the power source voltages. However, no practical technology has developed to meet the requirement.

SUMMARY OF THE INVENTION

An object of this invention is to provide a semiconductor device which can improve the trade-off between the soft error and the withstanding voltage by utilizing different impurity concentration wells.

One of the features of this invention is that a plurality of wells of the same conductivity type with different surface impurity concentrations are formed in the semiconductor body and a memory cell or cells are formed in that one of the wells which has the highest surface impurity concentration.

Further, this invention has a second feature that first wells of a first conductivity type (P) are formed in the semiconductor body (P or N), a first well of a second conductivity type (N) is formed in one or more wells selected from the first wells of the first conductivity type so as to form a second well or wells of the first (P) or second (N) conductivity type, and a memory cell or cells are formed in one of the wells having the highest surface impurity concentration.

Thus, the basic feature of this invention is that the second conductivity type well is formed in one or more selected wells of the first conductivity type in order to partly neutralize the first conductivity type impurity (P) with the second conductivity type impurity (N), thereby providing the first conductivity type well ($P^+$) having an impurity concentration lower than the remaining first conductivity type well or wells ($P^{++}$) formed in the semiconductor body. Alternately, the basic feature of this invention is that first conductivity type impurity is further doped into one or more of the first conductivity type low impurity concentration wells (P, $P^+$) to form at least one first conductivity type well of high impurity concentration ($P^{++}$). In this way, there can be obtained three different types of first conductivity type (P) regions, that is, the semiconductor body (P) itself, the first conductivity type well ($P^{++}$) formed in the semiconductor body, and the first conductivity type well ($P^+$) having the first conductivity type impurity concentration lowered by the doped second conductivity type impurity. Further, in a case where two different types of second conductivity type (N) wells are formed, or where two or more different types of first conductivity type (P) wells are formed, first conductivity type wells having more different degrees of impurity concentration can be obtained. If the structure is applied to the dynamic random access memory, it is preferable to form cells in one of the first conductivity type wells having the highest impurity concentration. This is because the leak current in the memory capacitor is required to be lowered and the soft error is required to be minimum.

Further, in this invention, it is possible to divide an ion-implantation step into a plurality of sub-steps and form a plurality of wells of variously selected degrees of impurity concentration by controlling the amount of impurity doped into each portion of the semiconductor substrate.

BRIEF DESCRIPTION OF THE DRAWINGS

FIGS. 2A to 2C are cross sectional views showing the manufacturing process of a semiconductor device with well structure according to one embodiment of this invention;

FIGS. 3A to 3M are cross sectional views showing the manufacturing process in a case where a trench type DRAM and the peripheral circuit thereof are formed on an N-type substrate with well structure according to one embodiment of this invention;

FIG. 4 is a cross sectional view showing the case in which the DRAM shown in FIG. 3 3M is formed in a P-type substrate;

FIG. 5 is a cross sectional view of a modification of the DRAM shown in FIG. 4;

FIG. 6 is a cross sectional view showing the case in which the DRAM shown in FIG. 5 is formed in a P-type substrate;

FIG. 13 is a cross sectional view showing the structure of a planar cell type memory which can be applied to a DRAM utilizing this invention;

FIG. 14 is a cross sectional view showing the structure of an SRAM which can be applied to this invention; and FIGS. 15A to 15E respectively show various CMOS inverters to which the present invention can be applied.

DETAILED DESCRIPTION OF THE PREFERRED EMBODIMENTS

Figure 1:
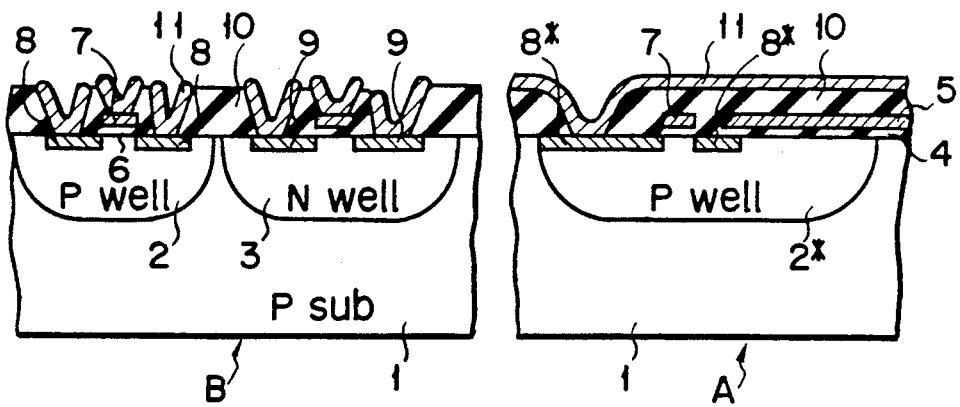
FIG. 1 is a cross sectional view of a semiconductor device with the conventional well structure.

There will now be described an embodiment of this invention with reference to the drawings. First, as shown in FIG. 2A, boron is ion-implanted using the photolithographic method into that part of P-type semiconductor body 101 which is allocated for formation of first P-well region 102-1 of cell area A in a dynamic RAM. In this case, the ion-implantation dosage amount is $2 \times 10^{14}$ cm$^{-2}$ and the acceleration voltage is 100 keV. At the same time, boron is also ion-implanted into that part which is allocated for formation of second P-well region 102-2 of peripheral circuit section B. After this, the semiconductor structure is subjected to a first heat treatment at a temperature of 1190° C. in an N$_2$ gas atmosphere for about 6 hours so as to form P-well regions 102-1 and 102-2. FIG. 2A shows the semiconductor structure after the heat treatment. In FIG. 2A, xxx indicates ion-implanted boron.

Next, phosphorus 104 is ion-implanted into a portion which is allocated for formation of first N-well region 106 and internal portion 105 of second P-type well 102-2 by using resist film 103 with the dose amount of $5 \times 10^{13}$ cm$^{-2}$ and at an acceleration voltage of 100 keV. After this, the semiconductor structure is subjected to a second heat treatment at a temperature of 1190° C. in an N$_2$ gas atmosphere for about 4 hours. As a result, first P-well region (P++) 107 having a surface impurity concentration of $5 \times 10^{17}$ cm$^{-3}$ is formed in cell area A, and second P-well region (P+) 105 having a surface impurity concentration of $2 \times 10^{17}$ cm$^{-3}$ is formed in the N-channel region of peripheral circuit B.

Then, capacitor insulation film 108, storage electrode (polysilicon) 109, N+-type diffusion layer 110, gate electrode (polysilicon) 111 of a write-in/readout transistor, and wiring layer (aluminum) 112 for the bit line are formed in cell area A. Further, gate electrode (polysilicon) 113 of an N-channel transistor, gate electrode (polysilicon) 114 of a P-channel transistor, diffusion regions 115 and 116, and lead-out wiring layer (aluminum) 117 for each electrode are formed in second P-well 105 and first N-well 106 of the peripheral circuit such as row/column decoders and sense amplifiers, thus forming a CMOS DRAM as shown in FIG. 2C.

FIGS. 3A to 3M are cross sectional views showing the manufacturing process used in a case where a trench type DRAM cell and the peripheral circuit thereof are formed on an N-type substrate with a well structure according to one embodiment of this invention.

As shown in FIG. 3A, resist film 303A is formed (patterning) on a predetermined portion of N-type substrate 301 covered with SiO$_2$ oxide film 302A having a thickness of about 1000 Å, and boron (P-type impurity) is ion-implanted via the openings of resist film 303A with the dose amount of $2 \times 10^{13}$ cm$^{-2}$ and at an acceleration voltage of 100 keV. As the result of the ion-implantation process, P-type impurity region 304A is formed in that portion of N-type substrate 301 which lies under the openings of resist film 303A.

Then, as shown in FIG. 3B, new resist film 303B is formed to have openings, and boron is ion-implanted via the openings of resist film 303B with the dose amount of $3 \times 10^{13}$ cm$^{-2}$ and at an acceleration voltage of 100 keV. As the result of the ion-implantation process, P-type impurity region 304B and P-type impurity region (304A+304B) are formed in N-type substrate 301 in addition to P-type impurity region 304A.

After this, resist film 303B is removed and the semiconductor structure is subjected to a heat treatment in the N$_2$ gas atmosphere at a temperature of 1190° C. for 6 hours. As a result, P-type impurity regions 304A, 304B, and (304A+304B) are thermally diffused (drive-in diffusion of P-well) to form P-well-2 having a low impurity concentration (P), P-well-3 having a mid range impurity concentration (P+), and P-well-1 having a high impurity concentration (P++), as shown in FIG. 3C.

Then, as shown in FIG. 3D, new resist film 303D is formed to have openings, and phosphorus (N-type impurity) is ion-implanted via the openings of resist film 303D with the dose amount of $3 \times 10^{13}$ cm$^{-2}$ and at an acceleration voltage of 160 keV. As the result of the ion-implantation process, N-type impurity regions 306D are formed in N-type substrate 301 and P-well-2.

After this, resist film 303D is removed and the semiconductor structure is subjected to a heat treatment in the N$_2$ gas atmosphere at a temperature of 1190° C. for 4 hours. As a result, N-type impurity regions 306D are thermally diffused (drive-in diffusion of N-well) to form N-well-1 and N-well-2 in N-type substrate 301 and P-well-2, respectively, as shown in FIG. 3E.

In the thermal diffusion process, N-type impurity of N well-2 is partly neutralized by P-type impurity of P-well-2, thus setting the impurity concentration (N) of N-well-2 lower than that (N+) of N-well-1.

Then, oxide film 302A is removed and field oxide film 302F is formed as shown in FIG. 3F. After this, thick resist film 302G is formed on the semiconductor structure, and trench 310 for the memory cell capacitor is formed in a predetermined portion of P-well-1 by means of a reactive ion etching (RIE) method, or by use of a laser beam as shown in FIG. 3G. Thereafter, a thermal oxide film (SiO$_2$) having a thickness of about 200 Å is formed on the silicon substrate, where from the resist was removed.

Next trench 310 and its peripheral thermal oxide film (SiO$_2$) are etched, a portion of field oxide film 302G around trench 310 is selectively removed, and a doped polysilicon layer (not shown) having an N-type impurity to be diffused into the surface area of trench 310 is formed on the semiconductor structure. Then, the semiconductor structure is subjected to a heat treatment to diffuse the N-type impurity from the doped polysilicon layer formed thereon into the surface area of trench 310, thus forming diffusion layer 311 of the capacitor electrode, as shown in FIG. 3H. The doped polysilicon layer is then removed after diffusion layer 311 has been formed.

As shown in FIG. 3I, after heat oxide film 302H has been removed, extremely thin $SiO_2$ film 302I of 100 Å is formed on surface substrate 301 which has diffusion layer 311 formed therein. Oxide film 302I is used as dielectric material of the memory capacitor. Polysilicon layer 312 of the capacitor electrode is formed around and on the internal surface of trench 310, with part of dielectric oxide film 302I disposed between polysilicon layer 312 and diffusion layer 311.

After this, the substrate surface is subjected to an oxidation process whereby oxide film 302J having a predetermined thickness (for example, 200 Å) is formed on substrate 301, and then polysilicon layer 313 to be used as a gate electrode is formed on oxide film 302J as shown in FIG. 3J.

Next, N-type diffusion regions 308 which form source and drain regions are formed on both sides of respective electrodes 313 of P-well-1 and P-well-3 by use of a resist film (not shown) as shown in FIG. 3K. Further, N-type diffusion layers 308 are formed in the end portions of N-well-1 and N-well-2.

Then, as shown in FIG. 3L, P-type diffusion layers 309 are formed in the end portions of P-well-1 to P-well-3 by use of a resist film (not shown). Further, P-type diffusion regions 309 which form source and drain regions are formed on both sides of respective electrodes 313 of N-well-1 and N-well-2.

Next, as shown in FIG. 3M, thick $SiO_2$ film 302M is formed on the entire surface of substrate 301, predetermined portions of second oxide film 302M are etched out to form openings, and aluminum wiring layers 314 are selectively formed in connection with respective N-type diffusion layers 308, P-type diffusion layers 309, and capacitor electrode 312, via the openings.

In FIG. 3M, P-channel transistors, constituting a power source voltage converting circuit, input/output circuit, input protection circuit, and the like, are formed in N-well-1, and P-channel transistors, constituting a sense amplifier and the like, are formed in N-well-2. Further, memory cells, and N-channel transistors, constituting sense amplifier, word driver, and the like, are formed in that one of P-well-1 to P-well-3 which has the highest impurity concentration, that is, P-well-1. In addition, the peripheral circuit and the like are formed in P-well-2.

Since N-well-2 is isolated from N-well-1 by means of P-well-2, voltages applied to N-well-1 and N-well-2 can be set to have different voltage levels. Further, it is possible that an N-well having an impurity concentration higher than that of P-well-1 (P++) be provided in a position which is not shown in the drawing.

FIG. 4 shows the case in which the DRAM shown in FIG. 3M is formed in a P-type substrate. N-well-2 is formed in P-well-2 in FIG. 3M, but P-well-2 is formed in N-well-3 in FIG. 4.

FIG. 5 is a modification of the DRAM shown in FIG. 4. In FIG. 5, P-well-1 of the memory cell is formed in N-well-2, and N-well-1* in P-well-2 is formed in the same step as that of N-well-1, or it is formed immediately after the step of forming N-well-1.

FIG. 6 shows the case wherein the DRAM shown in FIG. 5 is formed in a P-type substrate. The structure shown in FIG. 6 is similar to that of FIG. 5 except that the impurity conductivity type is inverted from either a P-type impurity to N-type impurity or vice versa.

Figure 7:
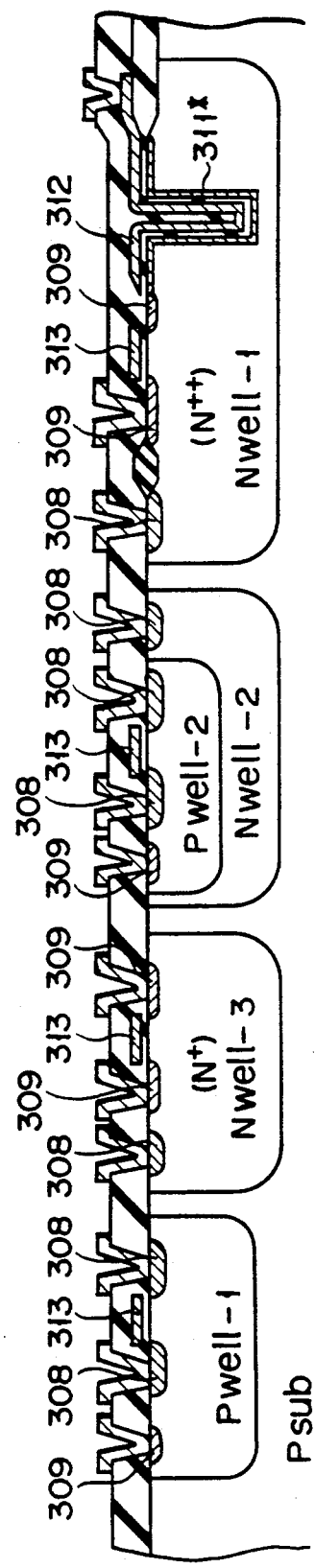
FIG. 7 is a cross sectional view of another modification of the DRAM shown in FIG. 4.

FIG. 7 is another modification of the DRAM shown in FIG. 4. In this embodiment, N-well-1 has the highest impurity concentration (N++), and a memory cell is formed therein. The peripheral circuit of the DRAM is formed in N-well-2 which has a lower impurity concentration than N-well-1. The term "highest impurity concentration" used in this embodiment refers to N-type impurity, and therefore P-well-1 may be formed to have a P-type impurity concentration which is higher than an N-type impurity concentration of N-well-1, for example.

Figure 8:
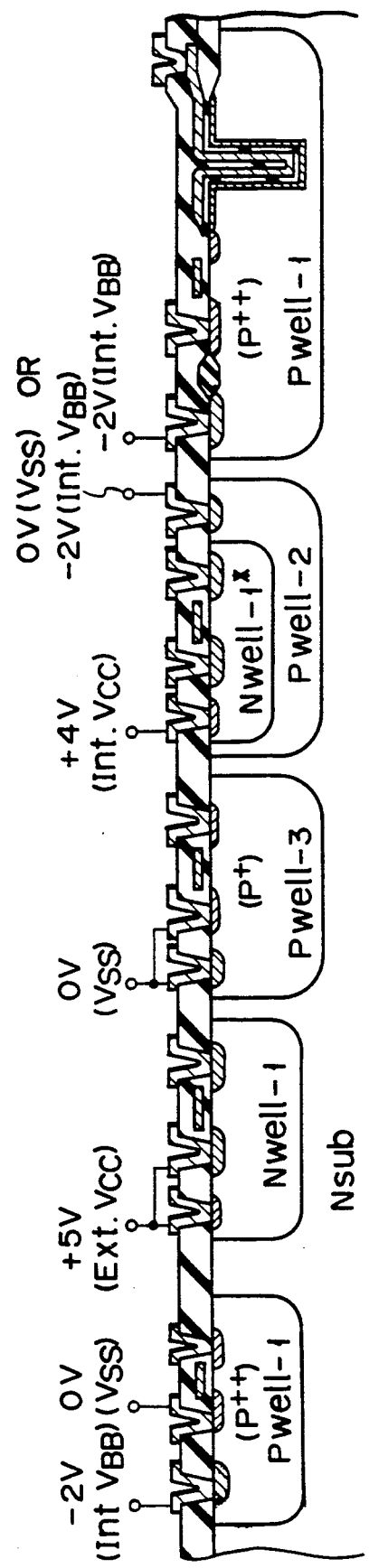
FIG. 8 is a cross sectional view of a modification of the DRAM which is shown in FIG. 3M and in which various power source voltages are applied.
Figure 9A:
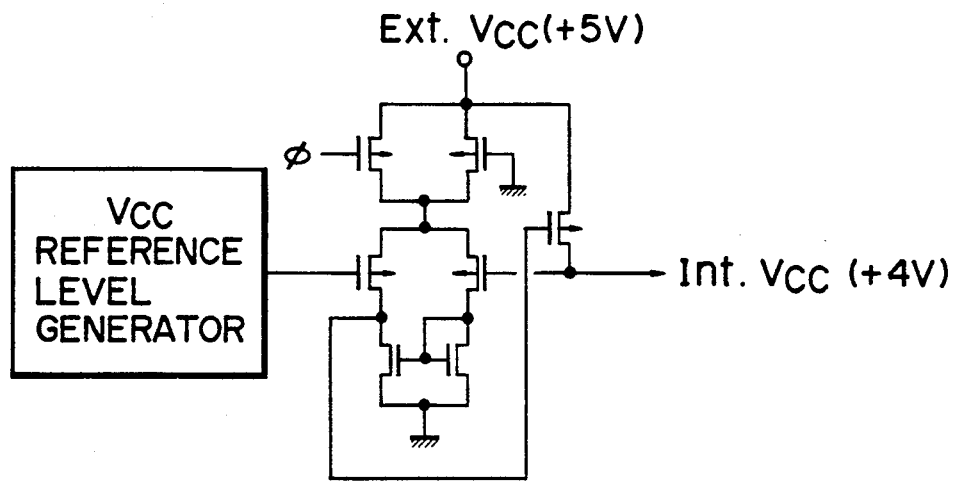
FIG. 9A shows a voltage generating circuit for supplying low voltage VCC to the multi-power source DRAM shown in FIG. 8.

FIG. 8 is a modification of the DRAM shown in FIG. 3M to which various power source voltages are applied. In this embodiment, external power source voltage ExtVCC (+5 V) is applied to N-well-1 wherein P-channel transistors constituting the input/output circuit and the like are formed. Internal power source voltage IntVCC (+4 V) which is derived by means of such a voltage generating circuit as shown in FIG. 9A is applied to N-well-1 formed in P-well-2. With the structure shown in FIG. 8, the pn junction between N-well-1 and P-well-2 is reversely biased because of the potential difference between ExtVCC (+5 V) and IntVCC (+4 V) so that N-well-1 is electrically isolated from P-well-2. Therefore, ExtVCC (+5 V) can be applied to the input/output circuit which requires a relatively high operation voltage, while at the same time IntVCC (+4 V or less) can be applied to the internal circuit which is desirably operated at a low voltage level.

Figure 9B:
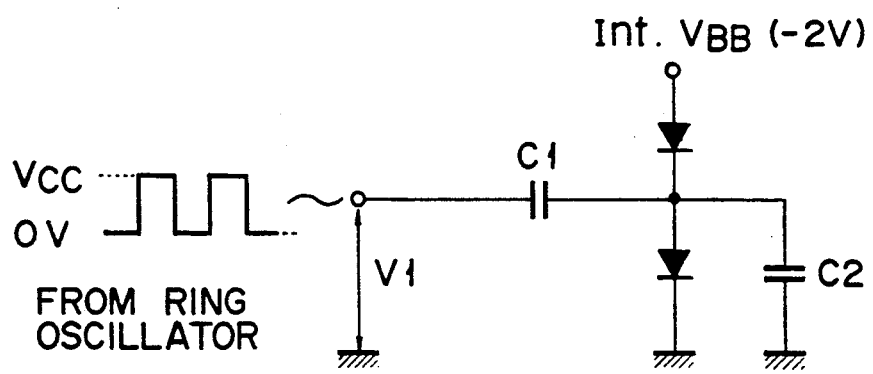
FIG. 9B shows a voltage generating circuit for supplying low voltage VBB to the multi-power source DRAM shown in FIG. 8.

Further, low negative voltage IntVBB (−2 V) which is applied to the memory cell in P-well-1, for example, can be derived from such a voltage generating circuit as shown in FIG. 9B.

Because the junction between P-well-1 and the N-type substrate is reversely biased by the potential difference between ExtVCC (+5 V) or IntVCC (+4 V) and IntVBB (−2 V), the low negative voltage IntVBB (−2 V) can thus be used. In other words, since bias voltages of various levels can be applied to the respective wells, the drain-source voltage of the transistor formed in the well can be freely set.

Incidentally, CMOS inverters shown in FIGS. 15A to 15E can be applied to the device of this invention.

Figure 10:
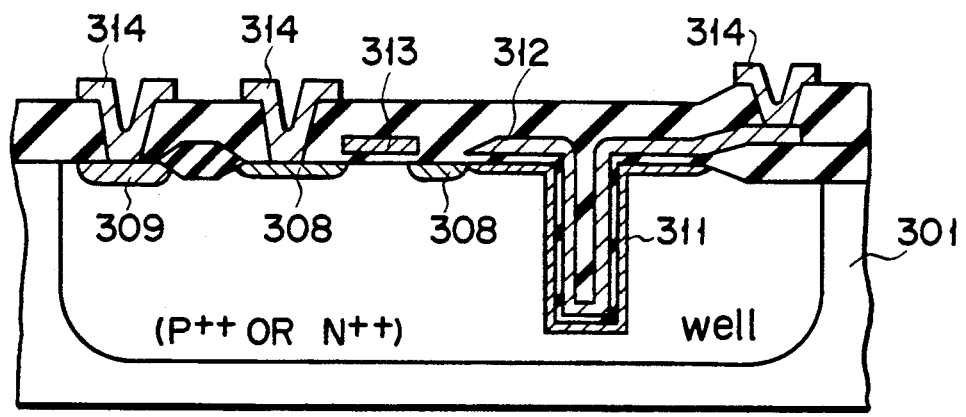
FIG. 10 is a cross sectional view showing the structure of a trench cell type memory which can be applied to a DRAM utilizing this invention.

The circuits shown in FIGS. 9A and 9B are disclosed in the following documents:
1986 IEEE International Solid-State Circuits Conference
ISSCC 86 / FRIDAY, FEB. 21, 1986
SESSION XIX: DYNAMIC RAMs
pages 272-273
FAM 19.7: An Experimental 4Mb CMOS DRAM
   Tohru Furuyama, Takashi Ohsawa,
   Yoji Watanabe, Hidemi Ishiuchi,
   Takeshi Tanaka, Kazunori Ohuchi,
   Hiroyuki Tango, Kenji Natori, Osamu Ozawa
Toshiba Semiconductor Device Engineering Laboratory/VLSI Research Center
Kawasaki, Japan FIG. 10 shows the structure of a trench cell type memory which can be applied to a DRAM utilizing this invention. This structure is the same as that of FIG. 3M (however, the conductivity type of substrate 301 can be P or N). Gate electrode 313 is used as a word line of the memory cell, and the aluminum wiring layer connected to diffusion region 308 which lies on the left side in FIG. 10 is used as a bit line of the memory cell.

Examples of trench type memories having structures other than those mentioned above are disclosed in the following U.S. Patent specifications:

U.S. Pat. No. 4,672,410
Miura et al. Jan. 9, 1987
"SEMICONDUCTOR MEMORY DEVICE WITH TRENCH SURROUNDING EACH MEMORY CELL"

U.S. Pat. No. 4,673,962
Chatterjee et al. Jan. 16, 1987
"VERTICAL DRAM CELL AND METHOD"

It should be understood that the contents disclosed in the above U.S. Patent specifications are incorporated in this application.

Figure 11:
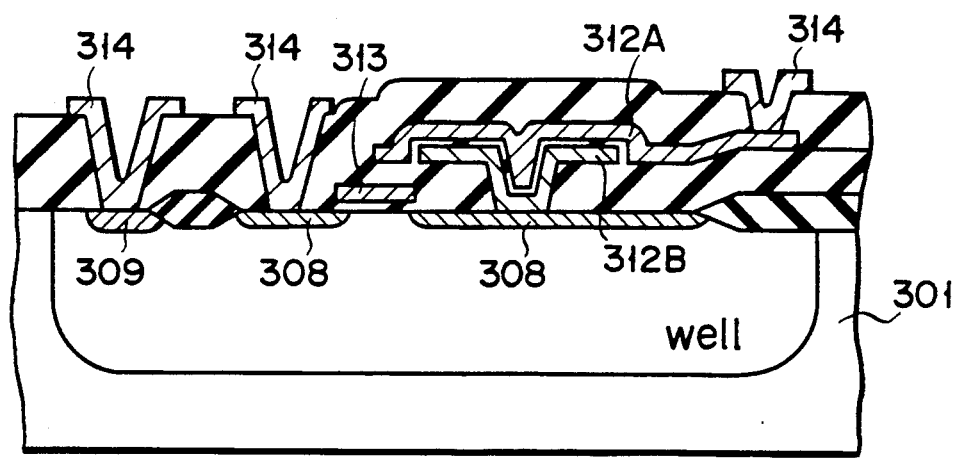
FIG. 11 is a cross sectional view showing the structure of a stacked cell type memory which can be applied to DRAM utilizing this invention.

FIG. 11 shows the structure of a stacked cell type memory which can be applied to a DRAM utilizing this invention. In the stacked cell type memory, a memory capacitor is constituted by concave pot type polysilicon storage node 312B and convex capacitor electrode 312A which is engaged with a concave portion of storage node 312B, via an oxide film (dielectric material), with a thickness of several tens Å.

Figure 12:
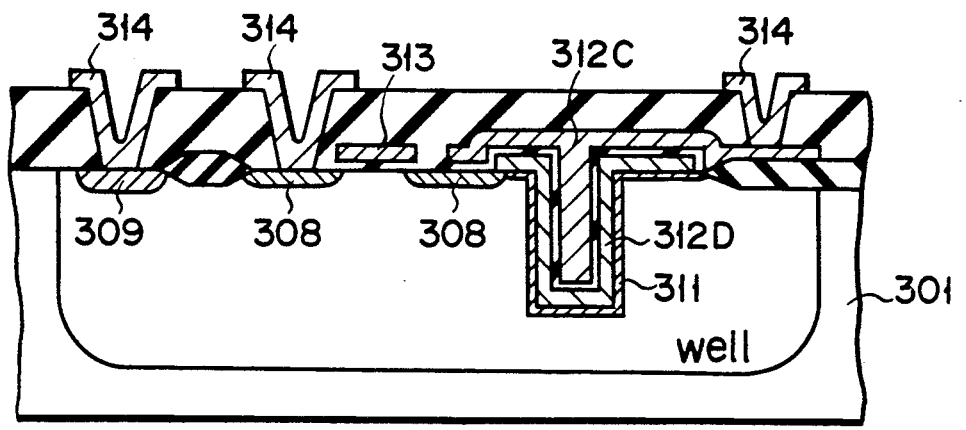
FIG. 12 is a cross sectional view showing the structure of a stacked trench (STT) cell type memory which can be applied to a DRAM utilizing this invention.

FIG. 12 shows the structure of a stacked trench (STT) cell type memory which can be applied to a DRAM utilizing this invention. The STT structure can be attained by applying the stacked cell structure of FIG. 11 to the trench structure of FIG. 10. The STT structure used in this invention is suitable for DRAMs of a large memory capacity, for example, 16 M bits.

FIG. 13 shows the structure of a planar cell type memory which can be applied to a DRAM utilizing this invention. This structure corresponds to the cell structure in area A of FIG. 2C.

FIG. 14 shows the structure of an SRAM which can be applied to this invention. In this embodiment, the drain wiring layer of the cell transistor is formed in the form of two-layered structure having first polysilicon layer (for internal wiring layer) 312F of low resistance and second polysilicon layer (for load resistor) 312G of high resistance.

The Bipolar-CMOS technology disclosed in the following documents can be applied as the conventional memory cell technology which can be used in this invention:

IEEE JOURNAL OF SOLID-STATE CIRCUITS, VOL. SC-22, No. 5, OCT. 1987
"An Experimental 1-Mbit BiCMOS DRAM"
pages 657–662
 GORO KITSUKAWA, RYOICHI HORI, YOSHIKI KAWAJIRI,
 TAKAO WATANABE, TAKAYUKI KAWAHARA, KIYOO ITOH,
 YUTAKA KOBAYASHI, MASAYUKI OOHAYASHI,
 KYOICHIRO ASAYAMA, TAKAHIDE IKEDA, AND
 HIROSHI KAWAMOTO 408-IEDM86
 "Advanced BiCMOS Technology for High Speed VLSI"
pages 408–411
 T. Ikeda*, T. Nagano, N. Momma, K. Miyata,
 H. Higuchi**, M. Odaka*, K. Ogiue*
 Hitachi Research Laboratory, 4029, Kuji-cho, Hitachi-shi, Ibaraki, 319-12, Japan
  * Device Development Center, 2326, Imai-cho, Oume-shi, Tokyo, 198, Japan
  ** Central Research Laboratory, Kokubunji-shi, Tokyo, 185, Japan
 Hitachi Ltd.

802-IEDM86
 "Bipolar CMOS merged structure for high speed M bit DRAM"
pages 802–804
 Y. Kobayashi, M. Oohayashi, K. Asayama, T. Ikeda* R. Hori and K. Itoh
 Hitachi Research Laboratory, Hitachi, Ltd., Hitachi, Ibaraki, Japan, 319-12
  * Device Development Center, Hitachi, Ltd., Oume, Tokyo, Japan 198
  ** Central Research Laboratory, Hitachi, Ltd., Kokubunji, Tokyo, Japan 185

Bipolar devices, which appear to be similar to but are substantially different from the semiconductor device of this invention, are disclosed in the following documents:

Physics and Technology of Semiconductor Devices
page 209
A.S. GROVE
Fairchild Semiconductor, Palo Alto
University of California, Berkeley
John Wiley and Sons, Inc., New York . London . Sydney Physics of Semiconductor Devices
SECOND EDITION
pages 192–197
S.M. Sze
Bell Laboratories, Incorporated
Murray Hill, N.J.
A WILEY-INTERSCIENCE PUBLICATION
JOHN WILEY & SONS
New York . Chichester Brisbane . Toronto . Singapore In general, the bipolar device includes high impurity concentration regions and low impurity concentration regions, but they are substantially different from the well of high impurity concentration (P++) and the wells of lower impurity concentration (P+, P) of this invention. More specifically, an active circuit element such as a memory cell is formed in the high impurity concentration (P++) well in this invention, but in the bipolar device, the high impurity concentration region (for example, emitter) is used as part of the active circuit element. It should be understood that the structure of this invention (combination of the high and low impurity concentration wells) is essentially different from that of the bipolar device (combination of low and high impurity concentration regions such as the emitter and collector).

This invention is not limited to the embodiments described above, and can be variously modified. For example, in the embodiment of FIG. 2C, a P-well of low impurity concentration is formed in peripheral circuit section B by using opposite conductivity type (P-type against N-type, for example) impurity. However, it is possible to form a P-well of high impurity concentration in cell section A by using the same conductivity type (P-type for P-type, for example) impurity to enhance the impurity concentration of the well. Further, in the embodiment, first N-well is formed in the first P-well to form the second P-well with impurity concentration lower than that of the first P-well. However, it is also possible to form low and high impurity concentration N-wells by forming a first N-well with impurity concentration higher than that of the first P-well in the first P-well.

As described above, according to this invention, wells with various degrees of impurity concentration can be easily formed, and therefore the wells can be selectively used to attain desired elements. In the DRAM or the like, a cell or cells can be formed in the well of the highest impurity concentration and the peripheral circuit section can be formed in the well with the impurity concentration next to the highest impurity concentration, thus making it possible to significantly improve the performance and characteristics of the semiconductor device.

What is claimed is:

1. A semiconductor device comprising:
   a semiconductor substrate;
   a first well of a first conductivity type formed in said semiconductor substrate;
   a second well of the first conductivity type formed adjacent to said first well in said semiconductor substrate such that nothing intervenes between said first and second wells except said semiconductor substrate, said second well having a surface impurity concentration lower than that of said first well;
   means for supplying a first potential to each of said first and second wells;
   a memory cell structure formed in said first well; and
   a transistor structure having a power supply voltage and being formed in said second well to function in combination with said memory cell structure, said memory cell structure having a power supply voltage smaller than said power supply voltage of said transistor structure.

2. A semiconductor device according to claim 1, wherein said semiconductor substrate is of a second conductivity type different from said first conductivity type, and wherein the device further comprises:
   a third well of the second conductivity type formed separately from said semiconductor substrate in said second well, a PN junction formed between said third well and said second well, said PN junction being reverse biased by a potential difference between the potential of said semiconductor substrate and the potential of said third well to electrically isolate said third well form the other wells, wherein at least part of said transistor structure is formed in said third well.

3. A semiconductor device according to claim 2, further comprising:
   voltage supplying means for supplying a potential to said third well different from the potential of said semiconductor substrate.

4. A semiconductor device according to claim 3, wherein at least one well of the second conductivity type is formed in said second well, and each of said second conductivity type wells is supplied with an independent potential.

5. A semiconductor device according to claim 3, wherein the potential of said semiconductor substrate is applied from an external power source of the semiconductor device, and said voltage supplying means includes a voltage converting circuit for converting the output potential of said external source to a different potential.

6. A semiconductor device according to claim 3, wherein said voltage converting circuit is formed in a well formed separately from said first well and said second well in said semiconductor substrate.

7. A semiconductor device according to claim 2, further comprising:
   a fourth well of the first conductivity type formed separately from said first well and said second well in said semiconductor substrate, said fourth well having an impurity concentration lower than that of said first well and having a second transistor structure formed therein to be used in combination with said memory cell structure.

8. A semiconductor device according to claim 7, wherein the impurity concentration of said fourth well is set lower than that of said first well and higher than that of said second well.

9. A semiconductor device according to claim 3, further comprising:
   a fifth well of the second conductivity type formed in said semiconductor substrate, said fifth well being formed separately from said first well, said second well, and said fourth well, wherein a third transistor structure used in combination with said memory cell structure is being formed in said fifth well.

10. A semiconductor device according to claim 9, wherein said third well has a majority carrier concentration lower than that of said fifth well.

11. A semiconductor device according to claim 7, wherein the majority carrier concentration of said fourth well is set lower than that of said first well.

12. A semiconductor device according to claim 7, wherein the impurity concentration of said first well is set higher than that of said fourth well by doping and diffusing an impurity of the first conductivity into said first well.

13. A semiconductor device according to claim 1, further including a well of the second conductivity type formed separately from the other wells in said semiconductor substrate and wherein said first well is formed in said well of the second conductivity type.

14. A semiconductor device according to claim 1, wherein said memory cell has a DRAM structure, and includes a memory cell capacitor section and an MOS transistor section of charging and discharging said memory cell capacitor section.

15. A semiconductor device according to claim 14, wherein said memory cell capacitor section has a trench cell structure.

16. A semiconductor device according to claim 14, wherein said memory cell capacitor section has a stacked cell structure.

17. A semiconductor device according to claim 14, wherein said memory cell capacitor section has a stacked trench cell structure.

18. A semiconductor device according to claim 14, wherein said memory cell capacitor section has a planar cell structure.

19. A semiconductor device according to claim 1, wherein an impurity of the second conductivity type is injected and diffused into a high impurity concentration region of a first conductivity type region.

20. A semiconductor device according to claim 1, wherein said memory cell structure has a SRAM structure.

21. A semiconductor device according to claim 1, wherein the majority carrier concentration of said second well is set lower than that of said first well.

22. A semiconductor device according to claim 1, wherein the impurity concentration of said first well is set higher than that of said second well by doping and diffusing an impurity of the first conductivity type into said first well.

23. A semiconductor device according to claim 1, wherein said semiconductor substrate is of a second conductivity type different from said first conductivity type and wherein the device further comprises:
a third well of the second conductivity type formed separately from said semiconductor substrate in said second well, a PN junction formed between said second well and said semiconductor substrate and reverse biased by a potential difference between the potential of said semiconductor substrate and the potential of said third well to electrically isolate said third well from the other wells, wherein at least part of said transistor structure is formed in said third well.

24. A semiconductor device according to claim 23, further comprising:
a fourth well of the first conductivity type formed separately from said first well and said second well in said semiconductor substrate, said fourth well having an impurity concentration lower than that of said first well and having a second transistor structure formed therein to be used in combination with said memory cell structure.

25. A semiconductor device according to claim 24, wherein the majority carrier concentration of said fourth well is set lower than that of said first well by doping and diffusing an impurity of the second conductivity type into said fourth well.

26. A semiconductor device according to claim 24, wherein the impurity concentration of said first well is set higher than that of said fourth well by doping and diffusing an impurity of the first conductivity type into said first well.

27. A semiconductor device according to claim 24, further comprising:
a fifth well of the second conductivity type formed in said semiconductor substrate separately from said first well, said second well, and said fourth well, and a third transistor being formed in said fifth well to be used in combination with said memory cell structure.

28. A semiconductor device according to claim 24, wherein said fourth well has an impurity concentration lower than that of said first well and higher than that of said second well.

29. A semiconductor device according to claim 28, wherein said third well has a majority carrier concentration lower than that of said fifth well.

30. A semiconductor device according to claim 23, further comprising voltage supplying means for supplying a potential to said third well different from the potential of said semiconductor substrate.

31. A semiconductor device according to claim 30, wherein at least one well of said second conductivity type is formed in said second well, and each well of said second conductivity type is supplied with an independent potential.

32. A semiconductor device according to claim 30, wherein a potential is applied to the semiconductor substrate from an external power source and wherein said voltage supplying means includes a voltage converting circuit for converting the output potential of the external power source to a different potential.

33. A semiconductor device according to claim 32, wherein said voltage converting circuit is formed in a well separately from said first well and said second well in said semiconductor substrate.

34. A semiconductor device comprising:
a semiconductor substrate of a first conductivity type;
a memory cell well of a second conductivity type different from said first conductivity type and formed in said semiconductor substrate;
a DRAM memory cell structure formed in said memory cell well;
a first peripheral cell structure formed in said memory cell well;
a first peripheral circuit well of the second conductivity type formed adjacent to said memory cell in said semiconductor substrate such that nothing intervenes between said memory cell well and first peripheral circuit well except said semiconductor substrate, said first peripheral circuit well having an impurity concentration lower than said impurity concentration of said memory cell well;
means for supplying a first potential to each of said memory cell well and first peripheral circuit well;
an internal well of said first conductivity type formed in said first peripheral circuit well to include a first MOS transistor structure to be used in combination with said memory cell structure;
a second peripheral circuit well formed separately from said memory cell well in said semiconductor substrate to include a second MOS transistor structure to be used in combination with said memory cell structure, said second peripheral circuit well having an impurity concentration lower than that of said memory cell well; and
a third peripheral circuit well formed separately from said memory cell well in said semiconductor substrate to include a third MOS transistor structure to be used in combination with said memory cell structure.

35. A semiconductor device comprising:
a semiconductor substrate of a first conductivity type;
a memory cell well of a second conductivity type formed in said semiconductor substrate;
a DRAM memory cell structure formed in said memory cell well;
a first peripheral circuit well of the second conductivity type formed adjacent to said memory cell well in said semiconductor substrate such that nothing intervenes between said first and second wells except said semiconductor substrate, the impurity concentration of said first peripheral circuit well being set lower than that of said memory cell well;
means for supplying a first potential to each of said memory cell well and first peripheral circuit well;
an internal well of said first conductivity type formed in said first peripheral circuit well to include a first MOS transistor structure to be used in combination with said memory well structure;
a second peripheral circuit well formed separately from said memory cell well in said semiconductor substrate to include a second MOS transistor structure to be used in combination with said memory cell structure, the impurity concentration of said second peripheral circuit well being set higher than that of said internal well formed at said first peripheral circuit well.

* * * * *